United States Patent
Hilton

[11] Patent Number: 5,892,245
[45] Date of Patent: Apr. 6, 1999

[54] BALL GRID ARRAY PACKAGE EMULATOR

[75] Inventor: Alan T. Hilton, Santa Clara, Calif.

[73] Assignee: Emulation Technology, Inc., Santa Clara, Calif.

[21] Appl. No.: 751,534

[22] Filed: Nov. 11, 1996

[51] Int. Cl.[6] ................................................. H01L 23/58
[52] U.S. Cl. .......................... 257/48; 257/727; 257/780
[58] Field of Search .................................. 257/727, 780, 257/48, 692, 698, 668

[56] References Cited

U.S. PATENT DOCUMENTS

| | | | |
|---|---|---|---|
| 4,069,497 | 1/1978 | Steidlitz | 257/727 |
| 5,140,405 | 8/1992 | King et al. | 257/727 |
| 5,426,405 | 6/1995 | Miller et al. | 257/727 |
| 5,500,556 | 3/1996 | Kosugi | 257/727 |
| 5,523,586 | 6/1996 | Sakurai | 257/727 |
| 5,587,885 | 12/1996 | Swamy | 257/727 |
| 5,691,041 | 11/1997 | Frankeny et al. | 257/727 |
| 5,729,433 | 3/1998 | Mok | 257/727 |

*Primary Examiner*—Olik Chaudhuri
*Assistant Examiner*—Nathan K. Kelley
*Attorney, Agent, or Firm*—Skjerven, Morrill, Morrill, MacPherson, Franklin & Friel; Brian D. Ogonowsky

[57] ABSTRACT

An adapter is described herein which releasably connects a ball grid array package to a printed circuit board, or to a testing board, such that the ball grid array package may be reused. In a preferred embodiment, an inexpensive base of the adapter contains solder balls or terminals on its bottom surface in the same pattern as the solder balls on the bottom of the ball grid array package. The terminals protrude slightly through the top surface of the base. A conductive elastomer, which conducts in one direction only, is then placed over the top surface of the base of the adapter so as to make electrical contact with the protruding terminals on the base. A ball grid array package is then placed over the conductive elastomer such that the solder balls on the bottom surface of the ball grid array package electrically contact respective terminals on the base. To releasably secure the ball grid array package in place, a lid is placed over the adapter and secured to the base of the adapter with screws or a latching mechanism. If it is desired to provide external access to the leads of the ball grid array package or to the terminals on the printed circuit board, a test probe board, having conductive pads leading to test pins, is contained in the adapter.

11 Claims, 4 Drawing Sheets

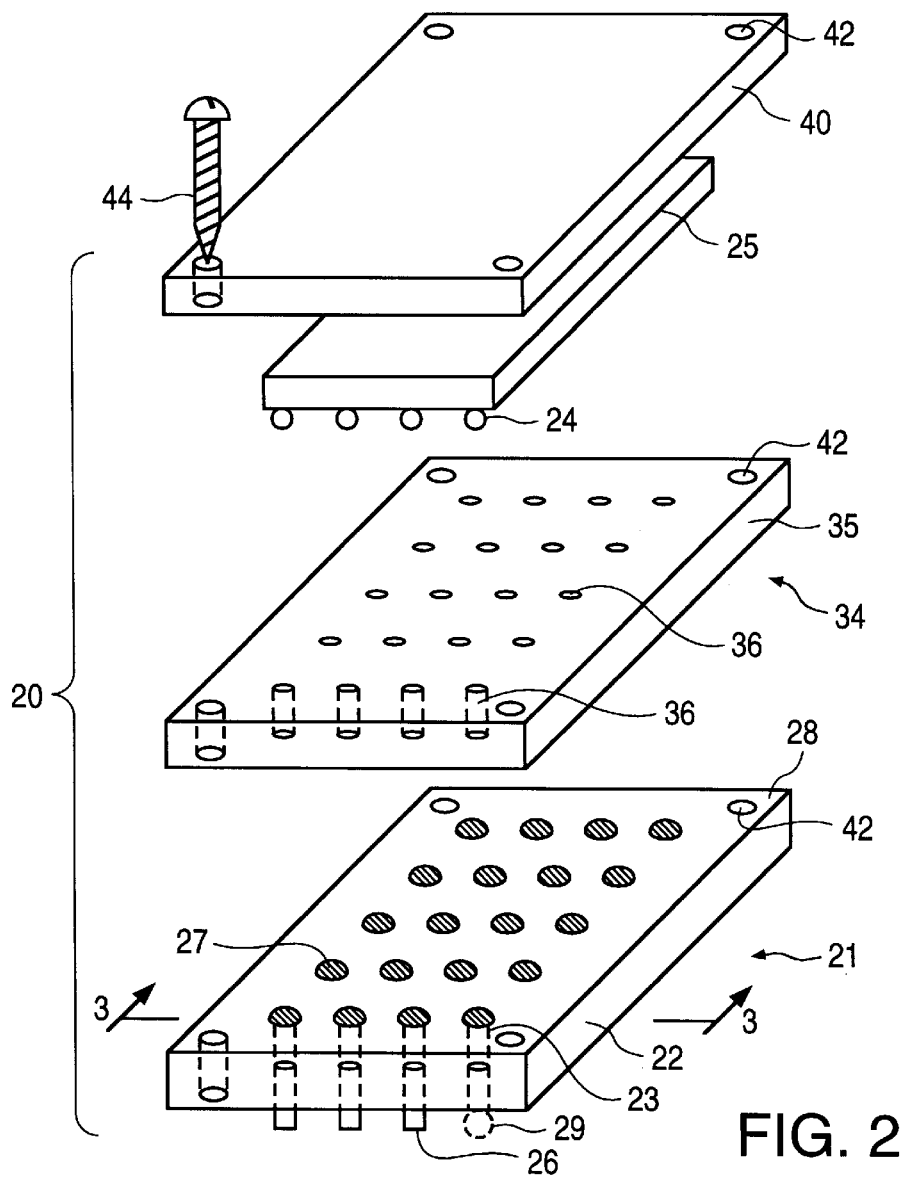
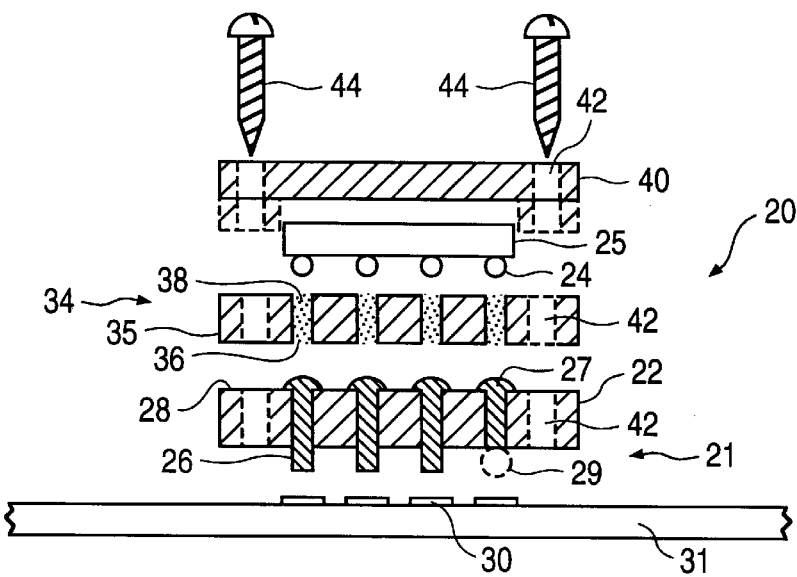

5,892,245

BALL GRID ARRAY PACKAGE EMULATOR

FIELD OF THE INVENTION

This invention relates to adapters which emulate a ball grid array type surface mounted package for testing purposes.

BACKGROUND OF THE INVENTION

A very area-efficient type of surface mounted package which is increasing in popularity is a ball grid array package 10, illustrated in FIG. 1. Package 10 contains an integrated circuit having its pads electrically connected to respective ones of conductive solder balls 12 distributed on the bottom surface of package 10 in an array. A printed circuit board 14 has formed on its surface a corresponding array of conductive pads 16 which align with the array of solder balls 12. Conductive traces (not shown) on the printed circuit board 14 lead from each of the pads 16 to other circuitry on board 14. To mount package 10 to board 14, package 10 is positioned on top of board 14, and the resulting structure is heated until solder balls 12 melt and fuse to pads 16.

Ball grid array packages provide a high density of terminals at a very low cost. Also, by not having any pins extending from the package, there is no risk of bending any leads and destroying the product.

For a designer to test a circuit board which utilizes a ball grid array package, the designer must first electrically connect the solder balls on the ball grid array package to the printed circuit board. This typically entails fusing the solder balls to the printed circuit board, hence, preventing that package from being used again on a different board. Such ball grid array packages may be relatively expensive, thus, adding to the development cost of the printed circuit board.

What is needed is an adapter for a ball grid array package which electrically connects a ball grid array package to a printed circuit board without requiring the solder balls on the ball grid array package to be fused to the board.

SUMMARY

An adapter is described herein which releasably connects a ball grid array package to a printed circuit board, or to a testing board, such that the ball grid array package may be reused. In a preferred embodiment, an inexpensive base of the adapter contains solder balls or terminals on its bottom surface in the same pattern as the solder balls on the bottom of the ball grid array package. The terminals protrude slightly through the top surface of the base.

A conductive elastomer, which conducts only in a vertical direction between its bottom and top surfaces, is then placed over the top surface of the base of the adapter so as to make electrical contact with the protruding terminals on the base.

A ball grid array package is then placed over the conductive elastomer such that the solder balls on the bottom surface of the ball grid array package electrically contact respective terminals on the base.

To releasably secure the ball grid array package in place, a lid is placed over the adapter and secured to the base of the adapter with screws or a latching mechanism.

Using the adapter, only the inexpensive base need be fused to the printed circuit board under test. The remainder of the adapter and the ball grid array package may be reused.

If it is desired to provide external access to the leads of the ball grid array package or to the terminals on the printed circuit board, a test probe board, having conductive pads leading to test pins, is placed over the conductive elastomer. A second conductive elastomer layer is then provided between the test probe board and the ball grid array package.

A novel dielectric substrate having conductive elastomer columns and a method of making the dielectric substrate are also described.

BRIEF DESCRIPTION OF THE DRAWINGS

FIG. 2 is an exploded view of one embodiment of a ball grid array adapter which does not use a test probe board.

FIG. 3 is an exploded side view, in cross-section, of the adapter of FIG. 2.

DETAILED DESCRIPTION OF THE PREFERRED EMBODIMENTS

Figure 1:
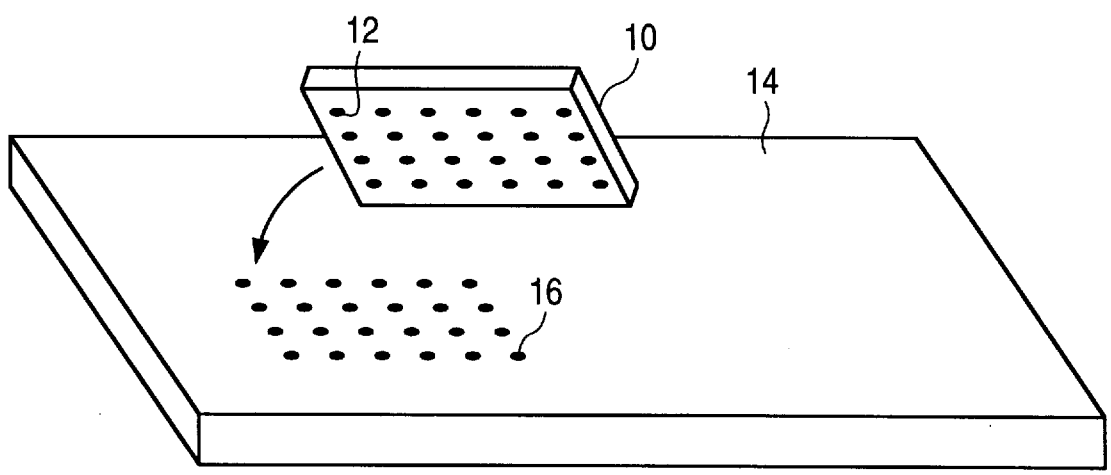
FIG. 1 is a perspective view of a conventional ball grid array package and a printed circuit board.

FIG. 2 is an exploded perspective view of the preferred embodiment ball grid array adapter 20, and FIG. 3 is an exploded side view of the same adapter along line 3—3 in FIG. 2. The adapter 20 includes a base 21. In one embodiment, base 21 consists of a fiberglass substrate 22 having virtually any thickness for a desired structural integrity. In one embodiment, base 21 is approximately 3 mm thick. Base 21 may be formed of any other dielectric material, such as a plastic or a resin.

A grid of holes 23 are formed in base 21 corresponding to a standard pattern of solder balls 24 on a ball grid array package 25. Standard patterns include hole pitches of 1.5 mm, $^{50}\!/\!_{1000}$ inch, 1 mm, and staggered rows with a $^{50}\!/\!_{1000}$ inch gap between rows. Metal pins 26, such as formed of a copper alloy coated with gold, are then press fit through each of holes 23. Pins 26 may include a head 27 which extends slightly above the top surface 28 of base 21.

In an alternate embodiment, shorter pins 26 may be press fit through holes 23, and solder balls 29 (shown in dashed outline) then placed on the ends of pins 26 on the bottom surface of base 21.

The solder balls 29 or pins 26 extending from the bottom of base 21 will ultimately be soldered or mounted to contact pads 30 (FIG. 3) on a printed circuit board 31. The contact pads 30 are arranged in the same pattern as solder balls 24 on the bottom surface of the ball grid array package 25.

There may be more holes 23 than pins 26, since the dielectric substrates 22 and 35 are intended to be generic, with the pattern of pins 26 being customized for a particular ball grid array package.

An intermediate layer 34 comprises a dielectric substrate 35 with holes 36 formed therein. The dielectric substrate 35 may be identical to the dielectric substrate 22 forming base 21. Holes 36 are filled with a resilient elastomer 38 (FIG. 3) containing, for example, silver particles. Other suitable types of conductive elastomers may consist of a resilient elastomer with conductive wires or conductive particles which provide a conductive path through the entire thickness of the elastomer. Such a conductive elastomer 38 may be provided in liquid form to fill holes 36 in dielectric substrate 35. The pitch of the holes 36 in dielectric substrate 35 may be the same as that in base 21 and match the ball grid array pattern on the bottom surface of the ball grid array package 25. When the intermediate layer 34 is placed upon base 21, the head 27 of each of pins 26 extends slightly into its respective hole 36 in the dielectric substrate 35 to make electrical contact with the conductive elastomer 38 within the respective hole 36.

Next, the ball grid array package 25 is placed over the intermediate layer 34 so that each solder ball 24 is aligned with a respective hole 36 filled with a column of a conductive elastomer 38. Each solder ball 24 protrudes a small distance into its respective hole 36 to electrically contact the conductive elastomer 38 within the hole 36. Accordingly, each solder ball 24 is now in electrical contact with a respective one of pins 26. If solder balls 29 are placed on the bottom of base 21, then each of the solder balls 24 on package 25 would be electrically connected to a respective one of solder balls 29 on base 21.

A suitable lid 40, such as formed of the same dielectric material as base 21, is then placed over the ball grid array package 25 to secure the package 25 and the intermediate layer 34 to base 21. This may be done in many ways. In the simplest embodiment, peripheral holes 42 are formed through dielectric substrates 22 and 35 and through lid 40 through which bolts or screws 44 are inserted to secure the various layers together. A suitable nut may be molded into the bottom of base 21 to receive a bolt.

In another embodiment, lid 40 may contain a clamping mechanism which clamps onto base 21. Such a clamp may be a resilient clamp, to be described with respect to FIG. 4.

The resulting adapter 20 has its pins 26 or solder balls 29 on base 21 mounted or fused to the corresponding terminals or contact pads 30 on the printed circuit board 31. Thus, the ball grid array package 25, intermediate layer 34, and lid 40 may be reused, since they are not permanently secured to the printed circuit board. Only the inexpensive base 21 need now be disposed of when the printed circuit board 31 is disposed of.

Figure 4:
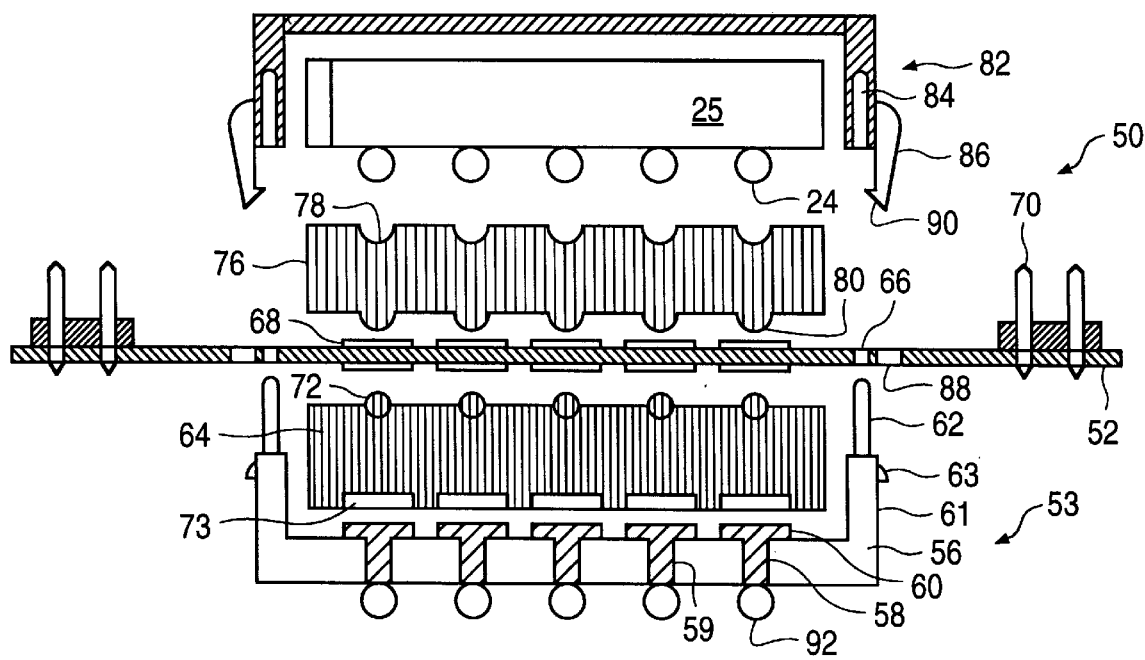
FIG. 4 is an exploded side view, in cross-section, of a ball grid array adapter utilizing a test probe board and a lid which is clamped onto a base of the adapter.

FIG. 4 is an exploded side view, in cross-section, of an embodiment of an adapter 50 which also includes a test probe board 52. Board 52 allows electrical access to the terminals on the ball grid array package 25 as well as to the corresponding contact pads on a printed circuit board.

Although adapter 50 in FIG. 4 may use the same base 21, intermediate layer 34, and lid 40 as described in FIGS. 2 and 3, alternative embodiments of the base, intermediate layer, and lid will be described. These alternative embodiments may also be used in an adapter not utilizing the test probe board 52.

In FIG. 4, a base 53 is formed of a dielectric substrate 56, such as a plastic, fiberglass, or resin. Pins 58 are then press fit through holes 59 formed in substrate 56 in a standard pattern previously described with respect to base 21. Pins 58 may have an enlarged head 60 to ensure a portion of each pin 58 extends above the top surface of the dielectric substrate 56. The dielectric substrate 56 has upward extensions 61 which support guide posts 62 as well as protrusions 63 for a clamp to be described later. The extensions 61 also help align a conductive elastomer layer 64 with respect to base 53.

A resilient conductive elastomer layer 64 is then seated within base 53 to electrically contact the heads 60 of pins 58. The conductive elastomer layer 64 may either be the intermediate layer 34 described with respect to FIG. 2 or may be a resilient layer of elastomer material having thin wires extending through the thickness of the elastomer layer in the vertical direction. Such wires may have pitches on the order of a few hundredths of an inch. Such conductive elastomers 64 are commercially available.

The test probe board 52 has holes 66 which are aligned with the guide posts 62, wherein guide posts 62 are then inserted through holes 66 to align the test probe board 52 with respect to base 53. Metal contact pads 68 on the test probe board 52 coincide with the pattern of conductive solder balls 24 on the bottom surface of the ball grid array package 25. There may be more contact pad 68 than solder balls 24, so that the test probe board 52 may be generic for a standard pitch.

Each of the conductive pads 68 are electrically connected via a trace to a conductive post 70 on the test probe board 52. A suitable connector for a tester may then be attached to posts 70 to generate electrical signals and/or receive electrical signals to either emulate the ball grid array package 25 or the printed circuit board 31 (FIG. 3) or to simply monitor the signals applied to the various solder balls 24 on the ball grid array package 25.

Optional bumps 72 and indentations 73 are provided on the conductive elastomer layer 64 for enhanced electrical contact.

Next, a second conductive elastomer layer 76 is provided on top of test probe board 52 to interface contact pads 68 with the solder balls 24 on the ball grid array package 25. This conductive elastomer layer 76 may be identical to the layer 64 or the intermediate layer 34 in FIG. 2. Indentations 78 and bumps 80 are optional for improved electrical conduction.

A lid 82 is then placed over the ball grid array package 25 and pressed down onto base 53. Guide posts 62 enter guide holes 84, and resilient plastic clamps 86 extend through holes 88 formed in the test probe board 52. The resilient clamps 86 have ends 90 which clamp onto the protrusions 63 formed on base 53. The ball grid array package 25 is now pressed down upon the conductive elastomer layer 76 such that a reliable electrical connection is made between each solder ball 24 on package 25 and each pin 58 in base 53. Each pin 58 may have a solder ball 92 located on its end so that base 53 may be soldered onto a printed circuit board, such as board 31 in FIG. 3. The ball grid array package 25 may then be tested while connected to the printed circuit board and reused along with the layer 64, test probe board 52, layer 76, and lid 82. To release the package 25, the lid 82 is simply pried upward to release the clamps 86.

Other means of clamping may also be used, such as screws or other types of latches. The various parts described in FIGS. 2 and 4 may be interchanged while achieving similar results. For example, the intermediate layer 34 of FIG. 2 may be interchanged with the conductive elastomer layer 64 or 76 in FIG. 4.

Figure 5:
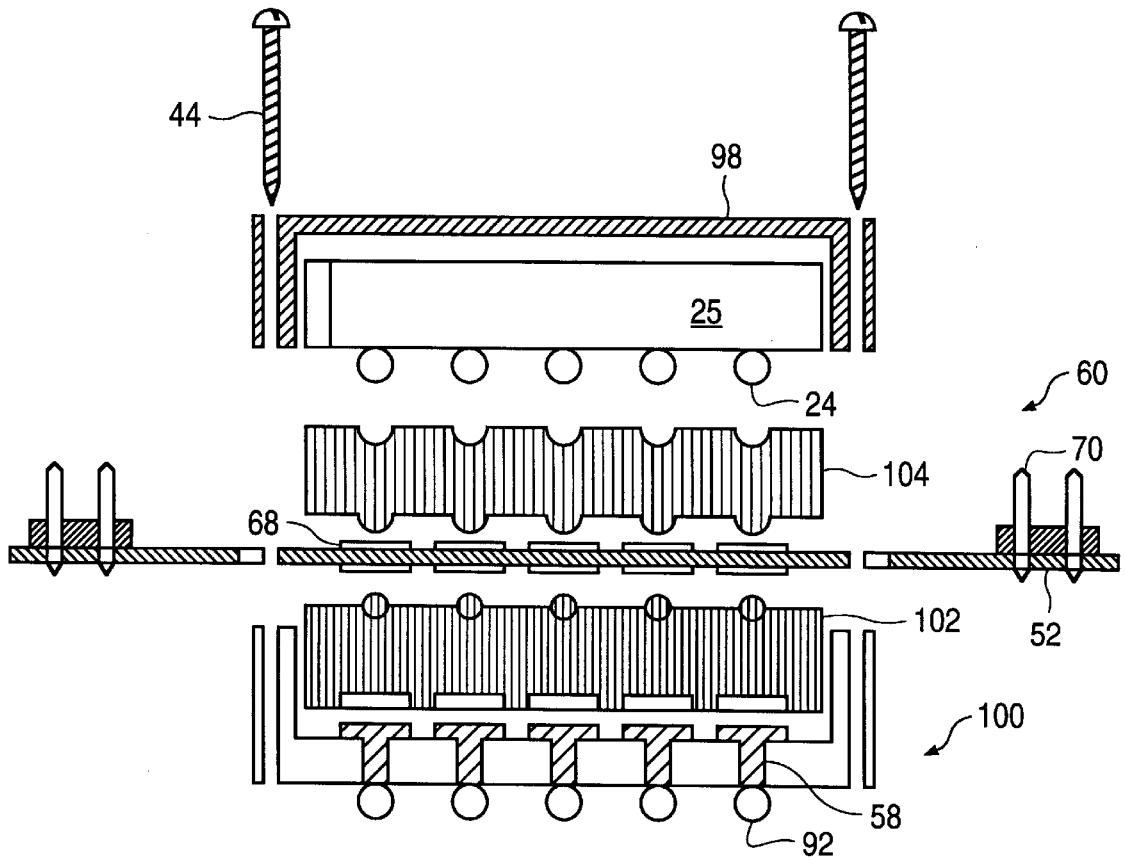
FIG. 5 is an exploded side view, in cross-section, of a ball grid array adapter similar to FIG. 4 but using a lid which is held in place by screws.

FIG. 5 is a side view, in cross-section, of another embodiment of an adapter 60, which may be identical to that shown in FIG. 4 except with the lid 98 being a screw-down type such as shown in FIG. 2 and with the corresponding modifications made to the base 100 and the conductive elastomer layers 102 and 104.

All elements in the various figures identified with the same numerals may be identical.

Figure 6:
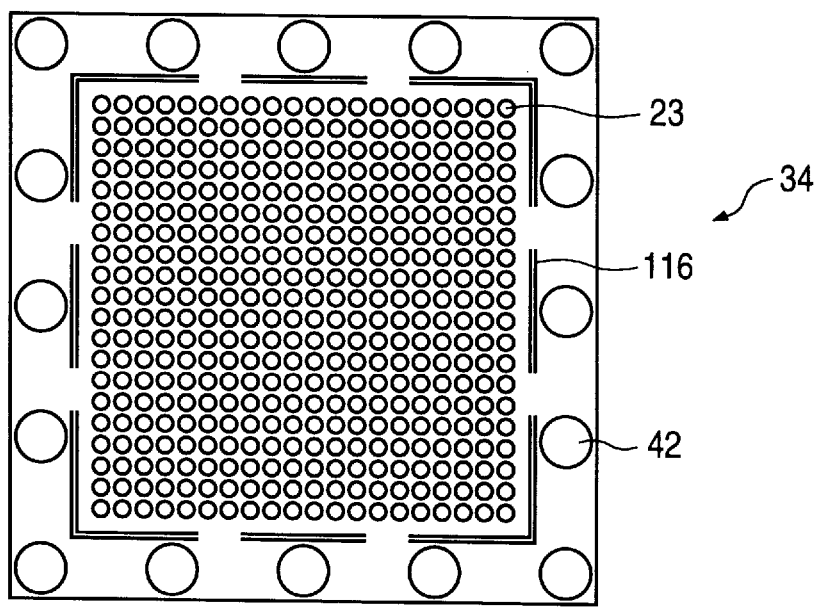
FIG. 6 is a top down view of a single dielectric wafer incorporating conductive columns.

FIG. 6 is a top plan view of the intermediate layer 34 illustrated in FIG. 2, where the dielectric is a square having each side being 1.38 inch. The screw hole 42 pitch is approximately 0.3 inch, the hole 23 pitch is 0.05 inch, and the ball grid array package extends to the dashed outline 116 with each side being 1.06 inch. Other dimensions may be used depending on the ball grid array package to be used.

The adapters described herein may be used with a variety of ball grid array packages, since the pitches of the solder balls on the package are standardized. The only customization involves the placement of pins in the base of the adapter.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An electrical structure comprising:

a dielectric base having a bottom surface with conductors extending therefrom, said conductors forming a pattern of a ball grid array package to be emulated, a top surface of said dielectric base exposing said conductors;

a first intermediate layer containing a conductive elastomer, said conductive elastomer physically contacting said top surface of said base so as to electrically contact said conductors; and a lid for being secured to said base and providing for a ball grid array package between said lid and said first intermediate layer, said lid for providing a force on said ball grid array package so that solder balls adhered to a bottom surface of said ball grid array package electrically contact conductive material in said conductive elastomer, such that said conductive elastomer makes an electrical connection between said solder balls and respective ones of said conductors on said bottom surface of said base.

2. The device of claim 1 wherein said first intermediate layer comprises a rigid dielectric substrate having holes formed therein, and an elastomeric conductor filling a plurality of said holes.

3. The device of claim 1 wherein said first intermediate layer comprises an elastomer layer containing wires extending between a top surface and a bottom surface of said elastomer layer.

4. The device of claim 1 further comprising:

a test probe board positioned over said first intermediate layer, said test probe board having contact pads in electrical contact with said conductive elastomer; and a second intermediate layer containing a conductive elastomer positioned over a top surface of said test probe board, said second intermediate layer for providing an electrical connection between said solder balls on said ball grid array package and said contact pads on said test probe board.

5. The device of claim 1 wherein said lid is secured to said base by a releasable clamp.

6. The device of claim 1 wherein said lid and said base have holes for insertion of a fastening means therethrough to secure said lid to said base.

7. The device of claim 1 further comprising a ball grid array package between said first intermediate layer and said lid, said solder balls of said ball grid array package being electrically connected to a printed circuit board through said conductive elastomer for testing said printed circuit board.

8. The device of claim 1 wherein said conductors extending from said bottom surface of said base are attached to terminals of a printed circuit board.

9. The device of claim 1 wherein said conductors extending from said bottom surface of said base comprise solder balls.

10. The device of claim 1 wherein said dielectric base has a pattern of holes formed therein with said conductors placed in said holes, said holes in said base being in a standard pattern for solder balls on a bottom surface of ball grid array packages.

11. The device of claim 10 wherein there are more holes in said base than said conductors.

\* \* \* \* \*